US012676628B2

(12) United States Patent
Kim et al.

(10) Patent No.: US 12,676,628 B2
(45) Date of Patent: Jul. 7, 2026

(54) VOLTAGE-TO-TIME CONVERTERS AND METHODS OF OPERATING SAME

(71) Applicant: Samsung Electronics Co., Ltd., Suwon-si (KR)

(72) Inventors: Jueon Kim, Suwon-si (KR); Taehyoung Kim, Singapore (SG); Donghyun Yoon, Singapore (SG); Myoungbo Kwak, Suwon-si (KR); Jaewoo Park, Suwon-si (KR); Youngdon Choi, Suwon-si (KR); Junghwan Choi, Suwon-si (KR)

(73) Assignees: Samsung Electronics Co., Ltd., Suwon-si (KR); Nanyang Technological University, Singapore (SG)

( * ) Notice: Subject to any disclaimer, the term of this patent is extended or adjusted under 35 U.S.C. 154(b) by 67 days.

(21) Appl. No.: 18/597,217

(22) Filed: Mar. 6, 2024

(65) Prior Publication Data

US 2024/0413834 A1     Dec. 12, 2024

(30) Foreign Application Priority Data

Jun. 8, 2023     (KR) ........................ 10-2023-0073734

(51) Int. Cl.
*H03M 1/12*     (2006.01)
*H03M 1/50*     (2006.01)

(52) U.S. Cl.
CPC ..................................... *H03M 1/50* (2013.01)

(58) Field of Classification Search
CPC .... H03M 1/50; H03M 1/0656; H03M 1/1245; H04L 25/03019
See application file for complete search history.

(56) References Cited

U.S. PATENT DOCUMENTS 9,263,949 B2     2/2016  Tsukuda et al.
11,356,110 B1    6/2022  Fan et al.
(Continued)

FOREIGN PATENT DOCUMENTS

CN     111010186 A     4/2020
CN     113595554 A     11/2021
(Continued)

OTHER PUBLICATIONS

Bae, Woorham "CMOS Inverter as Analog Circuit: An Overview" Journal of Low Power Electronics and Applications 9(3):26 (Aug. 2019).

(Continued)

*Primary Examiner* — Jean B Jeanglaude
(74) *Attorney, Agent, or Firm* — Wolf, Greenfield & Sacks, P.C.

(57)     ABSTRACT

A voltage-to-time converter (VTC) includes: a first inverter electrically connected between a first node, to which a clock signal is applied, and a second node, a first buffer electrically connected to the second node and to output a first output signal, a second inverter electrically connected between a third node, to which the clock signal is applied, and a fourth node, a second buffer electrically connected to the fourth node to output a second output signal, a first linearization circuit configured to receive a first input signal and electrically connected between the first node and the second node, and a second linearization circuit configured to receive a second input signal and electrically connected between the third node and the fourth node.

20 Claims, 12 Drawing Sheets

(56) References Cited

U.S. PATENT DOCUMENTS

| | | | | |
|---|---|---|---|---|
| 11,476,848 | B2 * | 10/2022 | Eimitsu | H03K 17/6874 |
| 2008/0126458 | A1 | 5/2008 | Shin | |
| 2018/0351770 | A1 * | 12/2018 | Chiu | H04L 7/0041 |
| 2022/0200021 | A1 * | 6/2022 | Hamada | B60L 58/30 |

FOREIGN PATENT DOCUMENTS

| | | | | |
|---|---|---|---|---|
| CN | 114679179 | A | 6/2022 | |
| CN | 115314049 | A | 11/2022 | |
| JP | 2015159434 | A | 9/2015 | |
| KR | 101644999 | B1 | 8/2016 | |
| WO | 2023010206 | * | 2/2023 | G01R 23/00 |
| WO | WO-2023010206 | A1 * | 2/2023 | G01R 25/005 |

OTHER PUBLICATIONS

Chiu et al. "A 32Gb/s Digital-Intensive Single-Ended PAM-4 Transceiver for High-Speed Memory Interfaces Featuring a 2-Tap Time-Based Decision Feedback Equalizer and an In-Situ Channel-Loss Monitor" 2020 ISSCC (Feb. 2020).

Won et al. "A 28-Gbs Receiver With Self-contained Adaptive Equalization and Sampling Point Control Using Stochastic Sigma-Tracking Eye-Opening Monitor" IEEE Transactions on Circuits and Systems I: Regular Papers 64(3):664-674 (Dec. 2016).

Yi et al. "A Time-Based Receiver With 2-Tap Decision Feedback Equalizer for Single-Ended Mobile DRAM Interface" IEEE Journal of Solid-State Circuits 53(1):144-154 (Jan. 2018).

Chae , et al., "A Duo-Binary Transceiver With Time-Based Receiver and Voltage-Mode Time-Interleaved Mixing Transmitter for DRAM Interface", IEEE Transactions on Circuits and Systems—II: Express Briefs, 68(7), 2021, 2409-2413.

Park , et al., "A 56-GB/s PAM-4 Receiver Using Time-Based LSB Decoder and S/H Technique for Robustness to Comparator Voltage Variations", IEEE Journal of Solid-State Circuits, 57(2), 2022, 562-572.

* cited by examiner

VOLTAGE-TO-TIME CONVERTERS AND METHODS OF OPERATING SAME

REFERENCE TO PRIORITY APPLICATION

This application claims priority under 35 U.S.C. § 119 to Korean Patent Application No. 10-2023-0073734, filed Jun. 8, 2023, the disclosure of which is hereby incorporated herein by reference.

BACKGROUND

The inventive concept relates to integrated circuit devices and, more particularly, to time-based receivers that support higher data bandwidths and methods of operating same.

A semiconductor memory device may be categorized as a volatile memory device or a nonvolatile memory device according to whether data stored therein is lost when power thereto is cut off, or not. A volatile memory device typically has a fast read/write speed, but loses stored data when power thereto is cut off. On the contrary, a nonvolatile memory device still maintains data therein even when power thereto is cut off.

Recently, along with the improvement of the performance of semiconductor memory devices, higher communication speeds (e.g., interface speeds) between a memory controller and a semiconductor memory device are typically demanded. Accordingly, research into multi-level signaling schemes that are capable of transmitting a plurality of bits during one unit interval (UI) has been conducted.

SUMMARY

The inventive concept provides a linearization circuit for improving the linearity between an input and an output of a voltage-to-time converter (VTC), which is included in a time-based (TB) receiver for receiving a signal of a multi-level signaling scheme and an operating method thereof.

According to an aspect of the inventive concept, there is provided a VTC including: a first inverter connected between a first node to which a clock signal is applied and a second node, a first buffer connected to the second node to output a first output signal, a second inverter connected between a third node to which the clock signal is applied and a fourth node, and a second buffer connected to the fourth node to output a second output signal. In addition, a first linearization circuit is provided, which is configured to receive a first input signal and is connected between the first node and the second node, and a second linearization circuit is provided, which is configured to receive a second input signal and is connected between the third node and the fourth node.

According to another aspect of the inventive concept, there is provided a TB receiver including: a VTC configured to receive an input signal and output two output signals having different delay times so as to identify a data value of the input signal based on a delay time difference of the output signals, a compensation circuit configured to receive the output signals as input values and output compensation signals by removing a noise component of inter-symbol interference (ISI), and a decoder configured to receive the compensation signals as input values and reconstruct a digital signal based on the compensation signals. According to some further aspects, the on-resistances of transistors included in the VTC are inversely proportional to delay times between the input signal and the first output signals, respectively.

According to another aspect of the inventive concept, there is provided a transmission and reception system including a transmitter configured to output a transmission signal based on multi-level signaling and a TB receiver configured to receive the transmission signal. The TB receiver includes: a VTC configured to receive an input signal and output two output signals having different delay times so as to identify a data value of the input signal based on a delay time difference of the output signals. Moreover, the on-state resistances of transistors included in the VTC are inversely proportional to delay times between the transmission signal and the first output signals, respectively.

BRIEF DESCRIPTION OF THE DRAWINGS

Embodiments of the inventive concept will be more clearly understood from the following detailed description taken in conjunction with the accompanying drawings in which:

FIG. 11 is a block diagram illustrating a TB receiver according to an embodiment.

DETAILED DESCRIPTION OF THE EMBODIMENTS

Hereinafter, embodiments of the inventive concept are described in detail with reference to the accompanying drawings.

Figure 1:
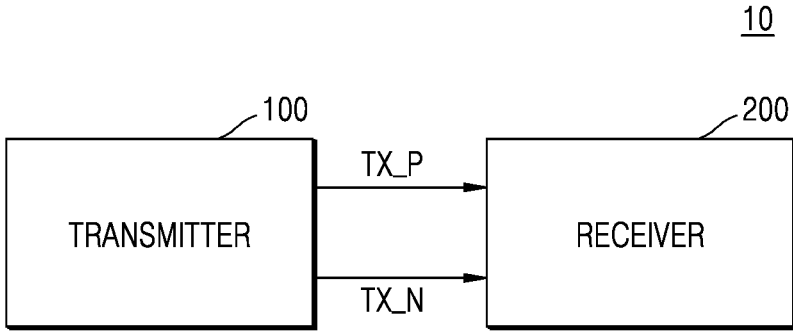
FIG. 1 is a block diagram illustrating a transmission and reception system according to an embodiment.

FIG. 1 is a block diagram illustrating a transmission and reception system 10 according to an embodiment. Referring to FIG. 1, the transmission and reception system 10 may include a transmitter 100 and a receiver 200, connected as shown. The transmitter 100 may transmit output signals TX_P and TX_N to the receiver 200, using a random channel, for example. In an embodiment, the output signals TX_P and TX_N may be transmitted to the receiver 200 in the form of a differential signal pair. However, in another embodiment, the output signals TX_P and TX_N may be transmitted to the receiver 200 in the form of a single-ended signal, unlike shown in FIG. 1.

According to some embodiments, the output signals TX_P and TX_N may be generated based on multi-level signaling. Multi-level signaling may be used as a means for compressing a bandwidth required to transmit data at a given bit rate. For example, in a simple binary scheme, two voltage levels are generally used to indicate a binary 1 and a binary 0, so that a symbol rate is equivalent to a bit rate. However, in multi-level signaling, m symbols may be used to represent data, with each symbol indicating data greater than one bit. As a result, the symbol rate is less than the bit rate, and the bandwidth is advantageously compressed.

That is, multi-level signaling may be used to increase a data transmission rate without increasing a data transmission frequency or power. An example of multi-level signaling is pulse amplitude modulation (PAM), and a multi-level signal in the PAM may indicate data of a plurality of bits. Moreover, in digital PAM, the number of pulse amplitudes may be a power of 2. For example, in 4-level PAM (i.e., PAM4), there may exist $2^2$ available pulse amplitudes, and in 8-level PAM (i.e., PAM8), there may exist $2^3$ available pulse amplitudes. However, the inventive concept is not limited thereto and may also be applied to PAM (K), in which there exist random K (K is a natural number of 3 or more) available pulse amplitudes.

In the transmission and reception system 10 for a memory interface, a high data rate is required. For example, to exchange video data between mobile dynamic random access memory (DRAM) and a central processing unit (CPU), the transmission and reception system 10 for a memory interface may be used. Because a mobile device is driven by a battery, the transmission and reception system 10 for a memory interface is supposed to be implemented to have a data rate as high as possible while still consuming relatively low power. As will be understood by those skilled in the art, in order for the transmission and reception system 10 to operate at a data rate as high as possible with low power, channel signal swing or a supply voltage may need to be reduced.

Herein, the channel signal swing may indicate a deviation of a particular value during a time when a signal is transmitted and received through a channel, and the particular value may be a voltage, a current, a frequency, or the like depending on the characteristic of the signal. For example, when a sinusoidal wave with an amplitude of 1 is transmitted and received through a channel, it may be indicated that the sinusoidal wave swings between 1 and −1. That is, the channel signal swing may indicate a maximum value or a minimum value which a particular value may have within a constraint condition of a channel.

Because a current flowing through a channel and a terminal resistor of a transceiver is proportional to the channel signal swing, if the channel signal swing is reduced, transmitter signal power may be proportionally reduced. However, when the channel signal swing is reduced, a large gain is required at a front-end circuit included in the receiver 200 to reconstruct data from a reception signal, and thus, power consumption of the receiver 200 may increase. However, in order for the transmission and reception system 10 to operate at a data rate as high as possible with lower power, a supply voltage is likely to be reduced.

In addition, a continuous-time linear equalizer (CTLE) or a decision feedback equalizer (DFE) may be included in the front-end circuit of the receiver 200, and the receiver 200 may increase a maximum data rate by using the CTLE or the DFE to widen an eye opening (and thereby reduce data errors). However, a supply voltage decrease of the transmission and reception system 10 may limit the maximum data rate of a transceiver due to a reduced transconductance gm and an increased delay time between an input and an output.

In detail, in the case of CTLE, because the CTLE has an analog characteristic, the performance of the CTLE typically decreases at a low supply voltage. For example, the maximum frequency and gain of the CTLE may decrease due to a decreased transconductance and increased loading, which is typically referred to as a gm/C constraint.

In the case of DFE, the maximum data rate of the DFE may be limited due to a delay time of a feedback loop of the DFE, which increases at a low supply voltage. To normally operate the DFE, the delay time of the feedback loop is supposed to be less than one unit interval (UI).

According to the inventive concept, the receiver 200 may be a time-based (TB) receiver to operate without the gm/C constraint and expand the upper limit of the delay time. In addition, an existing receiver with the gm/C constraint is referred to as a voltage-based (VB) receiver. The receiver 200 may generate signals having different delay times based on the output signals TX_P and TX_N of the transmitter 100 and reconstruct data based on the time difference between the different delay times of the signals. An operating method of the receiver 200 is described in detail hereinbelow.

Furthermore, although FIG. 1 shows two output signals TX_P and TX_N, the inventive concept is not limited thereto, and in another embodiment, the receiver 200 may generate signals having different delay times based on an output signal of the transmitter 100 in the form of a single-ended signal, and reconstruct data based on the time difference between the different delay times of the signals.

Figure 2:
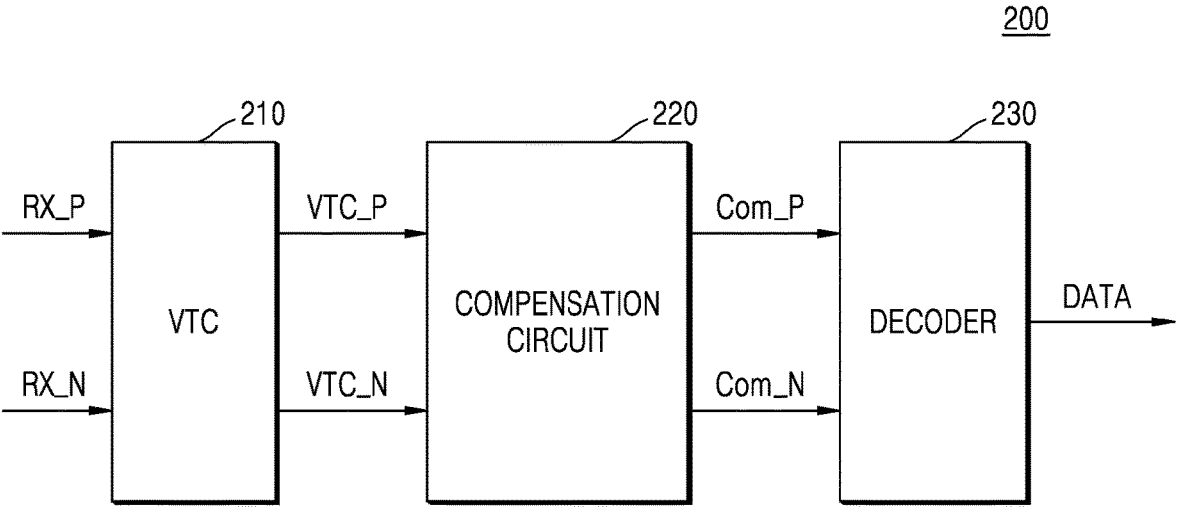
FIG. 2 is a block diagram illustrating a time-based (TB) receiver according to an embodiment.

FIG. 2 is a block diagram illustrating the receiver 200 according to an embodiment. Referring to FIG. 2, the receiver 200 may include a voltage-to-time converter (VTC) 210, a compensation circuit 220, and a decoder 230. The output signals TX_P and TX_N of the transmitter 100 described with reference to FIG. 1 may correspond to input signals RX_P and RX_N of the receiver 200 in FIG. 2, respectively.

The VTC 210 may receive the input signals RX_P and RX_N and output two output signals VTC_P and VTC_N having different delay times so as to identify a data value of the input signals RX_P and RX_N based on the delay time difference of the output signals VTC_P and VTC_N. Herein, the data value corresponding to the input signals RX_P and RX_N may be identified according to the magnitudes of voltages of the input signals RX_P and RX_N. In addition, the data value corresponding to the input signals RX_P and RX_N may be the same as a data value corresponding to the output signals VTC_P and VTC_N.

In other words, the VTC 210 may identify the data value of the input signals RX_P and RX_N according to the magnitudes of the voltages of the input signals RX_P and RX_N and generate the output signals VTC_P and VTC_N having a delay time difference corresponding to the identified data value. In the input signals RX_P and RX_N, a data value corresponds to the magnitudes of voltages, but in the output signals VTC_P and VTC_N, the delay time difference of the output signals VTC_P and VTC_N may correspond to a data value. That is, the VTC 210 may convert a data transmission means from the magnitude of a voltage to a time difference.

In an embodiment, the VTC 210 may receive the input signals RX_P and RX_N from the transmitter 100 (see FIG. 1) and output the output signals VTC_P and VTC_N having different delay times based on the received input signals RX_P and RX_N. And, in an embodiment, the output signals VTC_P and VTC_N generated by the VTC 210 may be provided to the compensation circuit 220.

The compensation circuit 220 may receive the output signals VTC_P and VTC_N output from the VTC 210, remove a noise component, such as inter-symbol interference (ISI), which may be generated in a process of transmitting the input signals RX_P and RX_N through a channel, and output compensation signals Com_P and Com_N with an amplified high frequency component. In an embodiment, the compensation signals Com_P and Com_N generated by the compensation circuit 220 may be provided to the decoder 230.

The decoder 230 may receive the compensation signals Com_P and Com_N output from the compensation circuit 220 and reconstruct a data signal DATA based on the received compensation signals Com_P and Com_N. Herein, the data signal DATA may be a digital signal and also data corresponding to data included in the output signals TX_P and TX_N of the transmitter 100 described with reference to FIG. 1. Herein, the transmitter 100 may output the output signals TX_P and TX_N based on multi-level signaling, and the data signal DATA may include a plurality of pieces of bit information (e.g., least significant bits (LSBs) and most significant bits (MSBs)) in one UI.

Moreover, the VB receiver (i.e., voltage-based receiver) described above with reference to FIG. 1 may have problems due to a low transconductance, a low voltage gain V/V, and small output voltage swing at a low supply voltage. However, a TB receiver (i.e., time-based receiver) according to the inventive concept may have a high voltage-to-time gain at a low supply voltage because the delay time difference of output signals increases as a supply voltage decreases. This feature that the TB receiver has a high voltage-to-time gain as a supply voltage decreases is described in detail with reference to FIG. 3.

Figure 3:
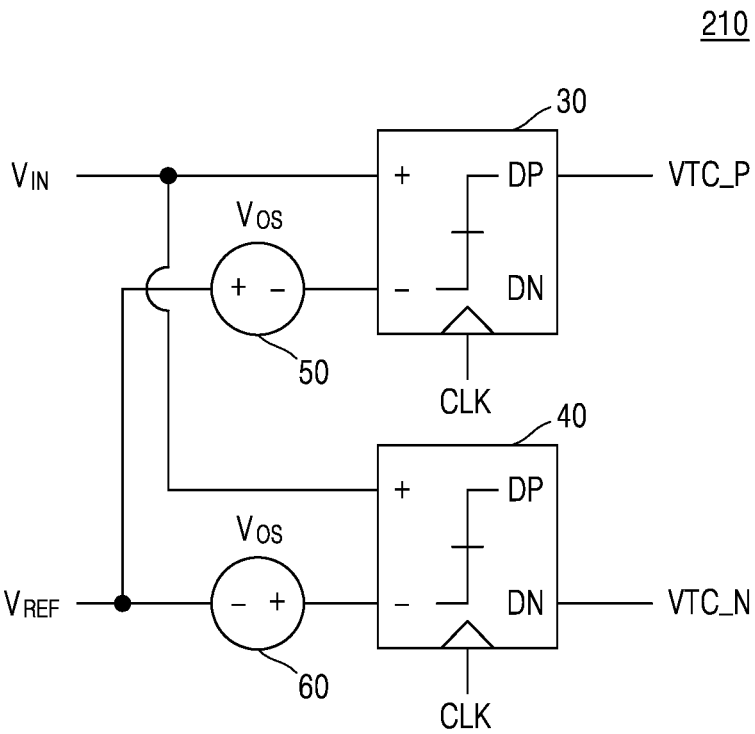
FIG. 3 is a block diagram illustrating a voltage-to-time converter (VTC) according to an embodiment.

FIG. 3 is a block diagram illustrating the VTC 210 according to an embodiment. Referring to FIG. 3, according to an embodiment, the VTC 210 may include a first differential comparator 30, a second differential comparator 40, a first offset voltage source 50, and a second offset voltage source 60. Herein, an input signal $V_{IN}$ may correspond to an output signal in the form of a single-ended signal of the transmitter 100 described with reference to FIG. 1.

Referring to FIG. 3, the first offset voltage source 50 may provide, to the first differential comparator 30, a voltage obtained by adding an offset voltage $-V_{OS}$ having a negative value to a reference voltage $V_{REF}$, and the second offset voltage source 60 may provide, to the second differential comparator 40, a voltage obtained by adding an offset voltage $V_{OS}$ having a positive value to the input signal $V_{IN}$.

The first differential comparator 30 may receive, as inputs, the input signal $V_{IN}$ and a voltage $V_{REF}-V_{OS}$ obtained by adding the offset voltage $-V_{OS}$ having a negative value to the reference voltage $V_{REF}$ and output a first output signal VTC_P having a first clock-to-Q delay time. In contrast, the second differential comparator 40 may receive, as inputs, the input signal $V_{IN}$ and a voltage $V_{REF}+V_{OS}$ obtained by adding the offset voltage $V_{OS}$ having a positive value to the reference voltage $V_{REF}$ and output a second output signal VTC_N having a second clock-to-Q delay time.

Herein, a clock-to-Q delay time indicates the time taken from when the level of a clock signal applied to a flip-flop or a register changed to when the level of an output end Q of the flip-flop or the register changes due to the changed level of the clock signal, and the first and second clock-to-Q delay times indicate clock-to-Q delay times of the first and second differential comparators 30 and 40, respectively.

In addition, a first clock-to-Q delay time $T_{CP}$ and a second clock-to-Q delay time $T_{CN}$ may be defined by Equations 1 and 2, respectively.

$$T_{CP} = \frac{C_L}{G_m} * \ln\left(\frac{V_{DD}}{|V_{RXIN} - (V_{REF} - V_{OS})|}\right) \quad \text{[Equation 1]}$$

$$T_{CN} = \frac{C_L}{G_m} * \ln\left(\frac{V_{DD}}{|V_{RXIN} - (V_{REF} + V_{OS})|}\right) \quad \text{[Equation 2]}$$

Herein, $G_m$ indicates a transconductance of each of the first differential comparator 30 and the second differential comparator 40, $C_L$ indicates an output load capacitance of each of the first differential comparator 30 and the second differential comparator 40, $V_{RXIN}-V_{REF}$ indicates a differential input voltage sampled at the falling edge of a clock signal CLK, and the first output signal VTC_P and the second output signal VTC_N may transition to a rising edge by being triggered by the falling edge of the clock signal CLK.

When the design specification of the first differential comparator 30 is the same as the design specification of the second differential comparator 40, a time difference $T_I$ between the rising edge of the first output signal VTC_P and the rising edge of the second output signal VTC_N may be defined by Equation 3. In addition, Taylor series may be used to simplify Equation 3 to Equation 4.

$$T_I = \frac{C_L}{G_m} * \quad \text{[Equation 3]}$$

$$\left(\ln\left(\frac{V_{DD}}{|V_{RXIN} - (V_{REF} - V_{OS})|}\right) - \ln\left(\frac{V_{DD}}{|V_{RXIN} - (V_{REF} + V_{OS})|}\right)\right)$$

$$T_I \approx \frac{-2}{V_{OS}} * \frac{C_L}{G_m} * (V_{RXIN} - V_{REF}) \quad \text{[Equation 4]}$$

Referring to Equation 4, the time difference $T_I$ between the rising edges of output signals VTC_P and VTC_N may be inversely proportional to a transconductance $G_m$. Because the transconductance $G_m$ decreases as supply power decreases, the time difference $T_I$ between the rising edges of the output signals VTC_P and VTC_N increases as the supply power decreases.

In addition, a time-to-voltage gain $|T_I/(V_{IN}-V_{REF})|$ may be defined by the time difference $T_I$ between the rising edges of the output signals VTC_P and VTC_N to the difference $V_{IN}-V_{REF}$ between the voltage of the input signal $V_{IN}$ and the reference voltage $V_{REF}$, and thus, the time-to-voltage gain $|T_I/(V_{IN}-V_{REF})|$ may increase as the supply power decreases. Herein, a VTC gain s/V may be converted into a voltage gain V/V by using a slew rate V/s of the output signals VTC_P and VTC_N. Therefore, because a VTC gain is inversely proportional to a supply voltage, the power efficiency of a TB receiver according to the inventive concept may be relatively high even at a relatively low supply voltage.

In some embodiments, the VTC gain of the VTC 210 included in the TB receiver may have non-linearity. That is, the VTC gain may maintain linearity in a first section within a range of input voltage values but have non-linearity in a second section within the range of the input voltage values. This non-linearity may decrease signal integrity (SI) when the TB receiver receives a signal based on multi-level signaling (e.g., PAM). Herein, the SI may be good as the VTC gain increases, and may be bad when an actual VTC gain is lower than a predicted VTC gain due to non-linearity in a particular section within the range of the input voltage values.

In order to solve the bad SI due to this non-linearity, the VTC 210 according to the inventive concept may include a linearization circuit, which is described in detail with reference to FIG. 4, which is a block diagram illustrating the VTC 210 according to an embodiment. Although not wishing to be bound by any theory of operations, some factors influencing the non-linearity described above may include the on-resistance of a transistor that is proportional to a delay time, the difference in a sequence of generating the output signals VTC_P and VTC_N in the VTC 210, and the like. The VTC 210 shown in FIG. 4 may remove these factors such that a VTC gain has good linearity. Herein, the sequence indicates an arrangement order of electronic devices associated with inputs and outputs to generate a desired output.

Figure 4:
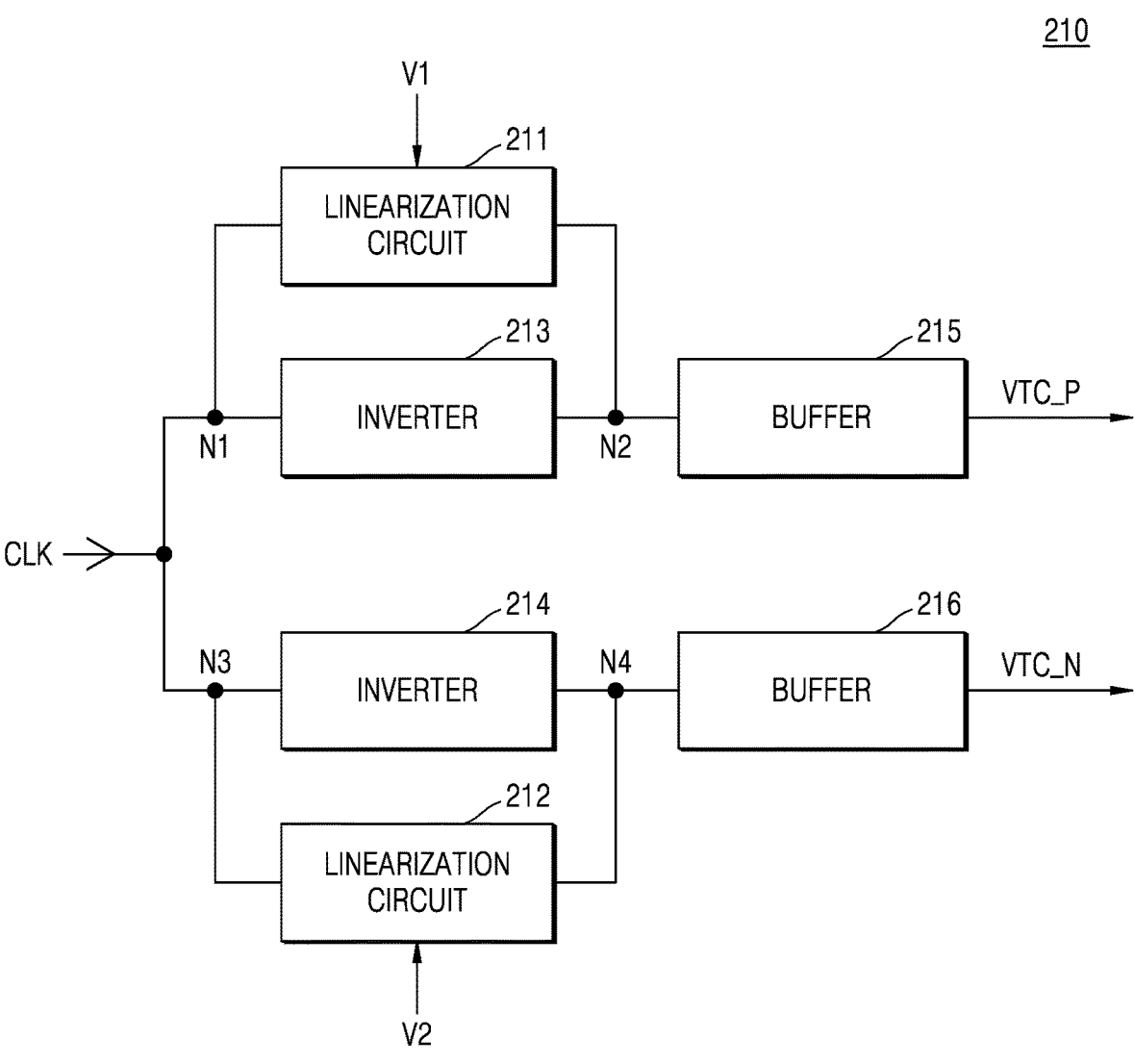
FIG. 4 is a block diagram illustrating a VTC according to an embodiment.

Referring to FIG. 4, the VTC 210 may include a first linearization circuit 211, a second linearization circuit 212, a first inverter 213, a second inverter 214, a first buffer 215, and a second buffer 216. A first input signal V1 and a second input signal V2 described with reference to FIG. 4 may include the input signals RX_P and RX_N in the form of a differential signal pair described with reference to FIG. 2 or the input signal $V_{IN}$ in the form of a single-ended signal described with reference to FIG. 3. In addition, in case of the input signal $V_{IN}$ in the form of a single-ended signal, the first input signal V1 may be the same as the second input signal V2.

The first linearization circuit 211 may be connected between a first node N1 to which the clock signal CLK is applied and a second node N2. The first inverter 213 may be connected between the first node N1 to which the clock signal CLK is applied and the second node N2. The first buffer 215 may be connected to the second node N2 and may output the first output signal VTC_P, as shown. Similarly, the second linearization circuit 212 may be connected between a third node N3 to which the clock signal CLK is applied and a fourth node N4. The second inverter 214 may be connected between the third node N3 to which the clock signal CLK is applied and the fourth node N4. The second buffer 216 may be connected to the fourth node N4 and output the second output signal VTC_N. Herein, the first node N1 may be the same as the third node N3, but unlike shown in FIG. 4, the first node N1 may be different and separated from the third node N3. In addition, the first linearization circuit 211 may receive the first input signal V1 as an input value, whereas the second linearization circuit 212 may receive the second input signal V2 as an input value. As described above, the first input signal V1 and the second input signal V2 may be in the form of a differential signal pair but are not limited thereto.

In an embodiment, the first and second linearization circuits 211 and 212 may be implemented so that the on-resistances of transistors are inversely proportional to delay times of the output signals VTC_P and VTC_N, respectively. In addition, it may be implemented that the on-resistances of transistors included in the first and second inverters 213 and 214 are inversely proportional to the delay times, respectively. This implementation is described in detail with reference to FIGS. 5 to 7.

The VTC 210 according to the inventive concept may have improved linearity of a VTC gain by making the on-resistance of a transistor inversely proportional to a delay time. In addition, the VTC 210 according to the inventive concept may generate the output signals VTC_P and VTC_N in the same sequence (in the order of a linearization circuit connected in parallel to an inverter and then a buffer), thereby improving the linearity of a VTC gain.

Figure 5:
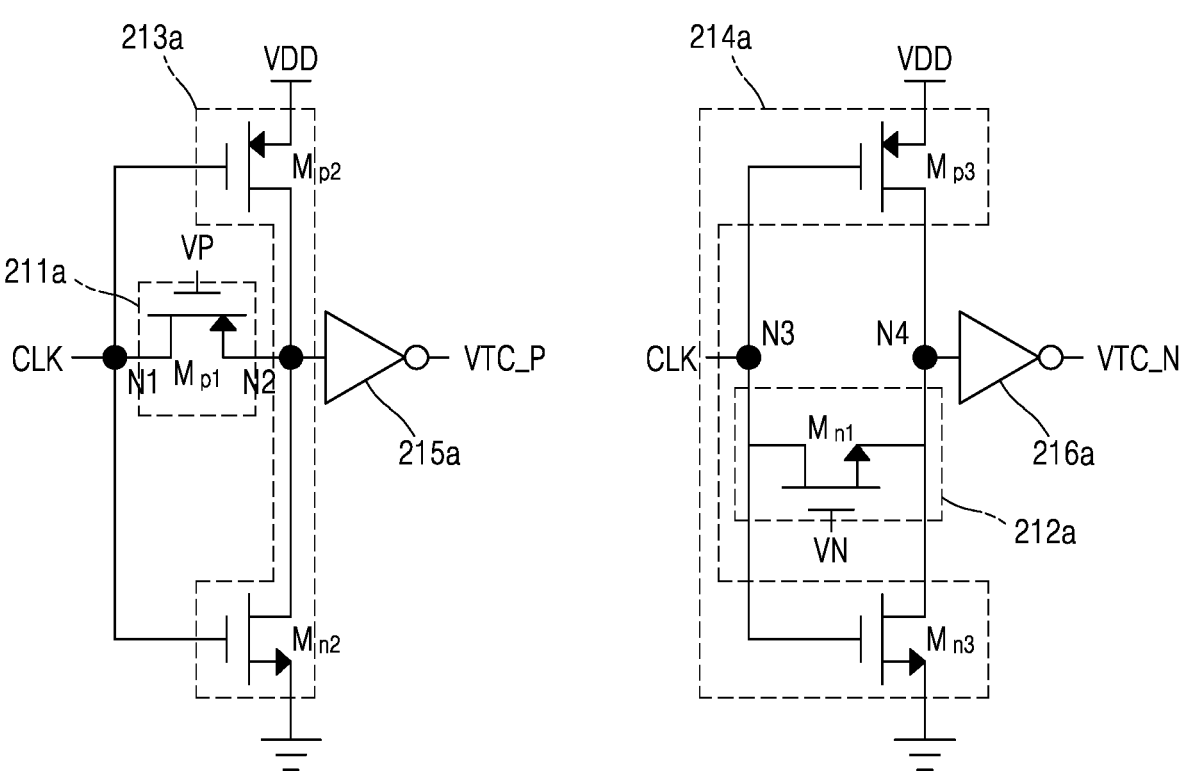
FIG. 5 is a circuit diagram illustrating an equivalent circuit of a VTC according to an embodiment.
Figure 6:
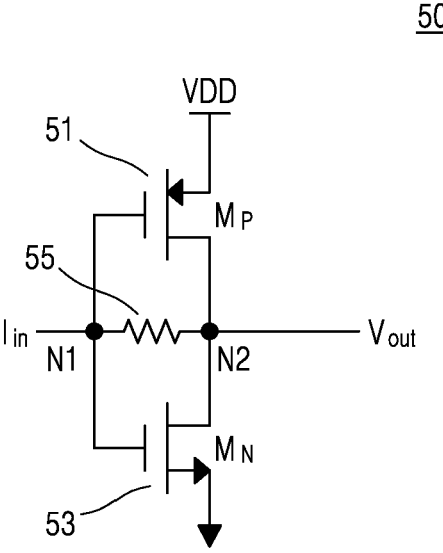
FIG. 6 is a circuit diagram for describing a VTC according to an embodiment.
Figure 7:
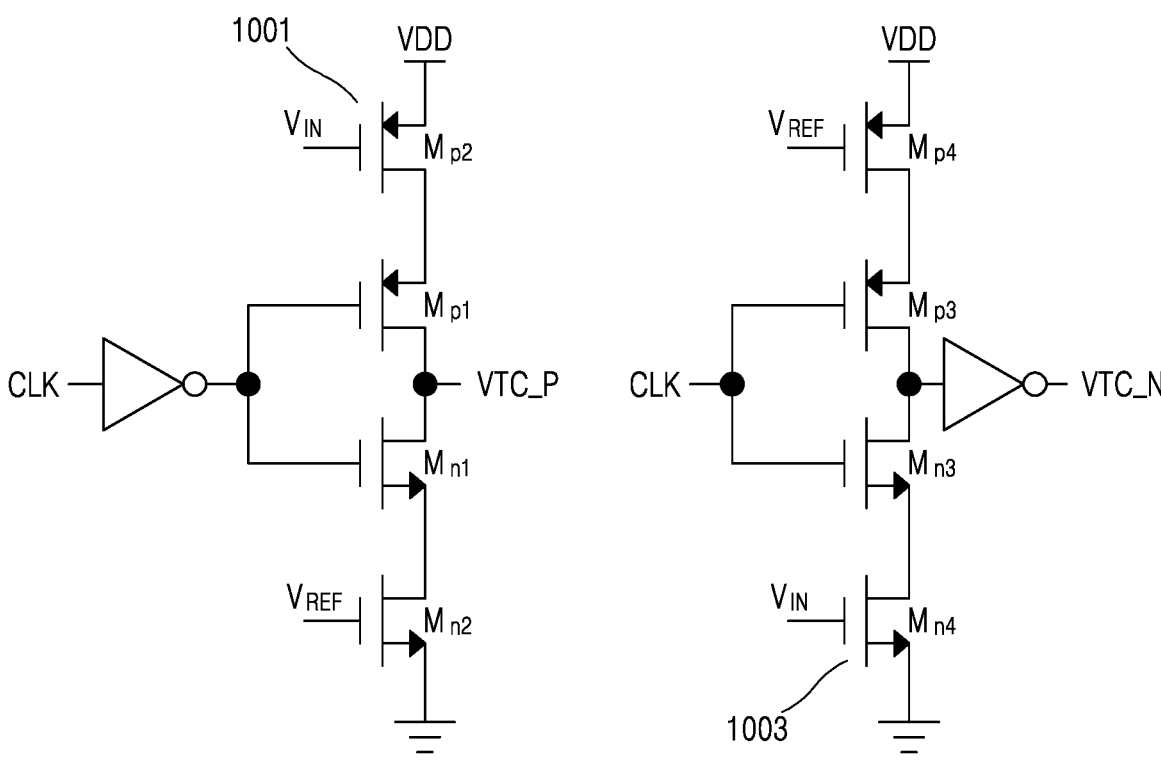
FIG. 7 is a circuit diagram illustrating an equivalent circuit of a VTC according to a comparative example.

FIG. 5 is a circuit diagram illustrating an equivalent circuit of a VTC 210a according to an embodiment. FIG. 6 is a circuit diagram for describing a VTC according to an embodiment. FIG. 7 is a circuit diagram illustrating an equivalent circuit of a VTC 1000 according to a comparative example (CE).

Referring to FIG. 5, the VTC 210a may include a first linearization circuit 211a, a second linearization circuit 212a, a first inverter 213a, a second inverter 214a, a first buffer 215a, and a second buffer 216a. The input signals RX_P and RX_N in the form of a differential signal pair described with reference to FIG. 2 may correspond to a first input signal VP and a second input signal VN, respectively. In addition, a VDD voltage to be described below may indicate a positive supply voltage.

The first linearization circuit 211a may be connected between the first node N1 to which the clock signal CLK is applied and the second node N2. The first inverter 213a may be connected between the first node N1 to which the clock signal CLK is applied and the second node N2. The first buffer 215a may be connected to the second node N2 and output the first output signal VTC_P. Similarly, the second linearization circuit 212a may be connected between the third node N3 to which the clock signal CLK is applied and the fourth node N4. The second inverter 214a may be connected between the third node N3 to which the clock signal CLK is applied and the fourth node N4. The second buffer 216a may be connected to the fourth node N4 and output the second output signal VTC_N.

Referring to FIG. 5, the first linearization circuit 211a may include a first P-type transistor $M_{p1}$ which has a drain terminal connected to the first node N1, a source terminal connected to the second node N2, and a gate terminal through which the first input signal VP is received as an input value. The second linearization circuit 212a may include a first N-type transistor $M_{n1}$ which has a drain terminal connected to the third node N3, a source terminal connected to the fourth node N4, and a gate terminal through which the second input signal VN is received as an input value.

Unlike as shown in FIG. 5, in another embodiment, the first linearization circuit 211a may include an N-type transistor having a gate terminal through which the first input signal VP is received as an input value, and the second linearization circuit 212a may include a P-type transistor having a gate terminal through which the second input signal VN is received as an input value. That is, each of the first linearization circuit 211a and the second linearization circuit 212a may be implemented by a switch, and these switches may be implemented by switches (e.g., an N-type metal oxide semiconductor (NMOS) and a P-type metal oxide semiconductor (PMOS)) in complementary relations. Moreover, in an embodiment, the first input signal VP and the second input signal VN may be one differential signal pair.

Referring again to FIG. 5, the first inverter 213a may include a second P-type transistor $M_{p2}$ and a second N-type transistor $M_{n2}$ using complementary metal oxide semiconductor (CMOS) technology, and the second inverter 214a may include a third P-type transistor $M_{p3}$ and a third N-type transistor $M_{n3}$ using CMOS technology.

The second P-type transistor $M_{p2}$ may have a source terminal to which the VDD voltage is applied, a gate terminal connected to the first node N1, and a drain terminal connected to the second node N2. The second N-type transistor $M_{n2}$ may have a source terminal to which a ground voltage is applied, a gate terminal connected to the first node N1, and a drain terminal connected to the second node N2.

The third P-type transistor $M_{p3}$ may have a source terminal to which the VDD voltage is applied, a gate terminal connected to the third node N3, and a drain terminal connected to the fourth node N4. The third N-type transistor $M_{n3}$ may have a source terminal to which the ground voltage is applied, a gate terminal connected to the third node N3, and a drain terminal connected to the fourth node N4.

The first buffer 215a may output the first output signal VTC_P by amplifying a signal of the second node N2. In addition, the second buffer 216a may output the second output signal VTC_N by amplifying a signal of the fourth node N4.

According to the inventive concept, by connecting, in parallel, to the first and second inverters 213a and 214a, the source terminals and the drain terminals of the first P-type transistor $M_{p1}$ and the first N-type transistor $M_{n1}$ of which the gate terminals receive input signals as input values, respectively, the on-resistances of the first to third P-type transistors $M_{p1}$, $M_{p2}$, and $M_{p3}$ are inversely proportional to the delay time of the first output signal VTC_P, and the on-resistances of the first to third N-type transistors $M_{n1}$, $M_{n2}$, and $M_{n3}$ are inversely proportional to the delay time of the second output signal VTC_N. In particular, the on-resistances of the first P-type transistor $M_{p1}$ and the first N-type transistor $M_{n1}$ included in the first and second linearization circuits 211a and 212a are inversely proportional to the delay times of the output signals VTC_P and VTC_N, respectively. By doing this, the linearity of a VTC gain may be improved. Herein, an on-resistance indicates a resistance value between the drain terminal and the source terminal of a transistor when the transistor is turned on.

When the first and second linearization circuits 211a and 212a are turned on, similarly to a feedback resistance, an on-resistance may be inversely proportional to a delay time. First, an inverter including a feedback resistance is described in detail with reference to FIG. 6.

Referring to FIG. 6, a circuit 50 includes an inverter implemented in the form of a CMOS and a feedback resistor 55 connected in parallel to the inverter. The inverter may include a P-type transistor 51 and an N-type transistor 53. The P-type transistor 51 may have a gate terminal connected to the first node N1 to which an input current $I_{in}$ is applied, a source terminal to which the VDD voltage is applied, and a drain terminal connected to the second node N2. The N-type transistor 53 may have a gate terminal connected to the first node N1 to which the input current $I_{in}$ is applied, a source terminal to which the ground voltage is applied, and a drain terminal connected to the second node N2. The feedback resistor 55 may be connected between the first node N1 and the second node N2.

A bandwidth $f_{-3dB}$ of the inverter connected in parallel to the feedback resistor 55 may be represented by Equation 5 below, where $R_F$ indicates a resistance value of a feedback resistor, A indicates the gain of an inverter, and $C_{in}$ indicates the input capacitance of the whole circuit.

$$f_{-3dB} = \frac{1+A}{2\pi R_F C_{in}} \qquad \text{[Equation 5]}$$

Referring to Equation 5, the bandwidth $f_{-3dB}$ is inversely proportional to the resistance value of the feedback resistor. In addition, because the delay time between an input signal and an output signal is proportional to a bandwidth, the delay time between the input signal and the output signal is inversely proportional to the resistance value of the feedback resistor.

Referring back to FIG. 5, by connecting, in parallel to the first and second inverters 213a and 214a, the source terminals and the drain terminals of the first P-type transistor $M_{p1}$ and the first N-type transistor $M_{n1}$ of which the gate terminals receive input signals as input values, respectively, the on-resistances of the first to third P-type transistors $M_{p1}$, $M_{p2}$, and $M_{p3}$ are inversely proportional to the delay time of the first output signal VTC_P and the on-resistances of the first to third N-type transistors $M_{n1}$, $M_{n2}$, and $M_{n3}$ are inversely proportional to the delay time of the second output signal VTC_N. In particular, the on-resistances of the first P-type transistor $M_{p1}$ and the first N-type transistor $M_{n1}$ included in the first and second linearization circuits 211a and 212a are inversely proportional to the delay times of the output signals VTC_P and VTC_N, respectively.

In detail, the first linearization circuit 211a may be configured so that the on-resistances of transistors (e.g., the second P-type transistor $M_{p2}$ and the second N-type transistor $M_{n2}$) included in the first inverter 213a are inversely proportional to the delay time between the first input signal VP and the first output signal VTC_P.

In addition, the first linearization circuit 211a may be configured so that the on-resistance of a transistor (e.g., the first P-type transistor $M_{p1}$) included in the first linearization circuit 211a is inversely proportional to the delay time between the first input signal VP and the first output signal VTC_P. Likewise, the second linearization circuit 212a may also be configured so that the on-resistances of transistors included in the VTC 210a are inversely proportional to the delay time between the second input signal VN and the second output signal VTC_N.

Referring to FIG. 7, because the VTC 1000 according to a CE does not include a feedback resistor (e.g., the feedback resistor 55 of FIG. 6), the resistance values of the on-resistances of transistors $M_{p1}$, $M_{p2}$, $M_{p3}$, $M_{p4}$, $M_{n1}$, $M_{n2}$, $M_{n3}$, and $M_{n4}$ included in the VTC 1000 according to a CE are proportional to a bandwidth. Therefore, delay times between the input signal $V_{IN}$ and the output signals VTC_P and VTC_N are proportional to the resistance values of the on-resistances of the transistors $M_{p1}$, $M_{p2}$, $M_{p3}$, $M_{p4}$, $M_{n1}$, $M_{n2}$, $M_{n3}$, and $M_{n4}$.

In addition, because the delay times between the input signal $V_{IN}$ and the output signals VTC_P and VTC_N are inversely proportional to the voltage value of the input signal $V_{IN}$, the VTC 1000 according to a CE has a very large non-linearity section of a VTC gain. Furthermore, because the output signals VTC_P and VTC_N are generated in different sequences (i.e., connection orders of an inverter and a VTC, for example, an order of an inverter and a VTC and an order of a VTC and an inverter), even though the same input signal $V_{IN}$ is applied to the gate terminal of a P-type transistor 1001 and the gate terminal of an N-type transistor 1003, it may be difficult to set a desired delay time difference between the output signals VTC_P and VTC_N. Accordingly, a non-linearity section of a VTC gain may increase and SI may decrease.

Compared to the VTC 1000 according to a CE described with reference to FIG. 7, the VTC 210a according to the inventive concept may advantageously solve the non-linearity of a VTC gain that occurs due to the on-resistance of a transistor, which is proportional to a delay time, and a difference in a sequence of generating each of two output signals generated by one VTC. In other words, the VTC 210a according to the inventive concept may have improved linearity of a VTC gain by making the on-resistance of a transistor inversely proportional to a delay time. In addition, the VTC 210a according to the inventive concept may generate the output signals VTC_P and VTC_N in the same sequence (in the order of a linearization circuit connected in parallel to an inverter and then a buffer), thereby improving the linearity of a VTC gain.

Figure 8:
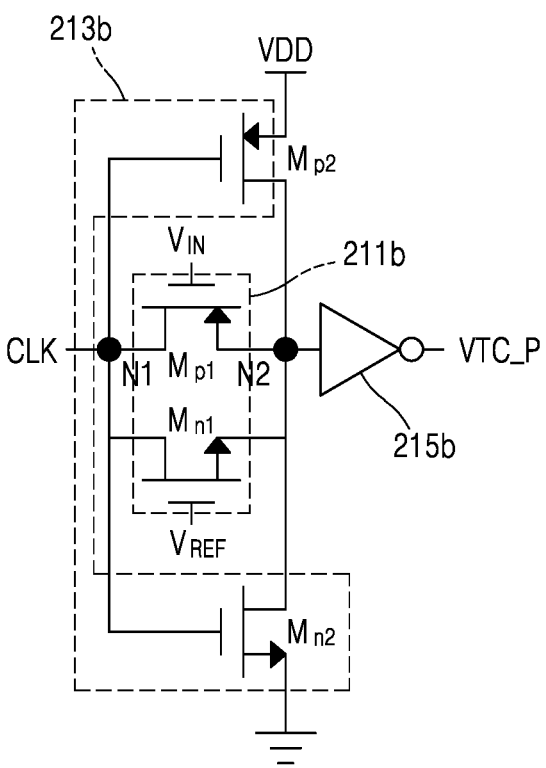
FIG. 8 is a circuit diagram illustrating an equivalent circuit of a VTC according to an embodiment.
Figure 8:
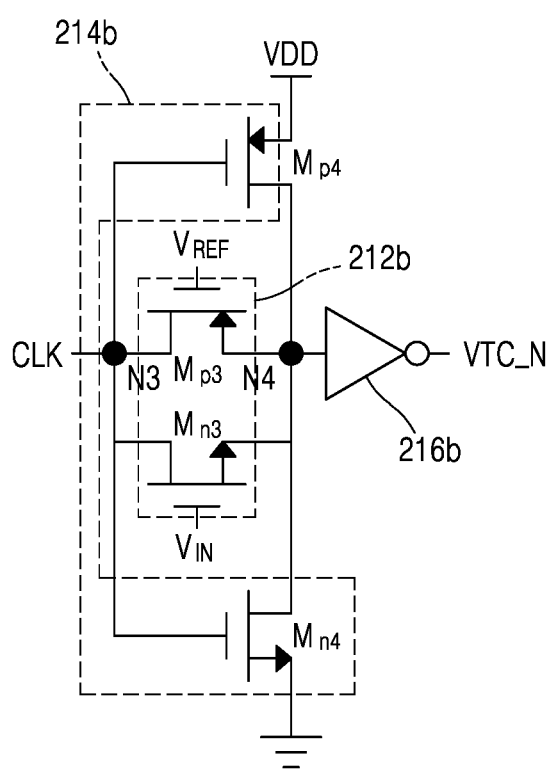
Figure 9:
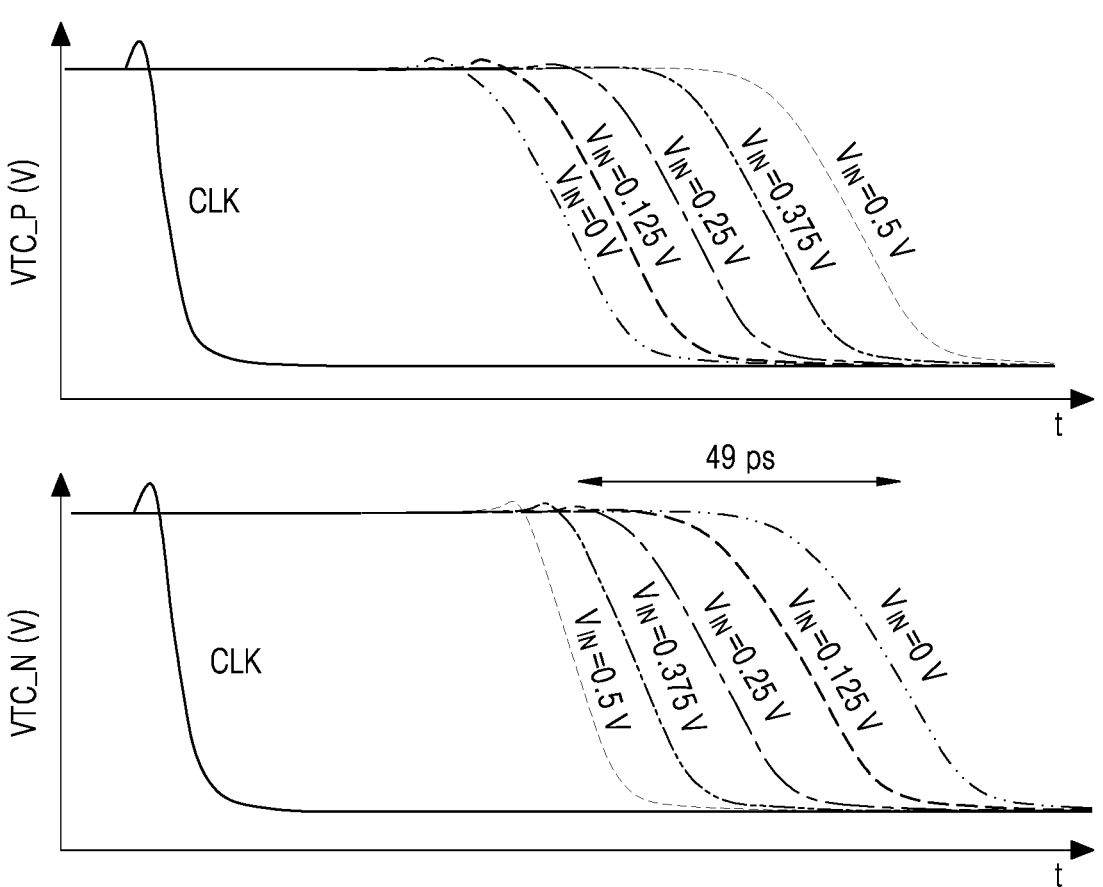
FIG. 9 is a graph illustrating output signals of a VTC according to an embodiment.

FIG. 8 is a circuit diagram illustrating an equivalent circuit of a VTC 210b according to an embodiment. FIG. 9 is a graph illustrating the output signals VTC_P and VTC_N of the VTC 210b according to an embodiment. Referring to FIG. 8, the VTC 210b may include a first linearization circuit 211b, a second linearization circuit 212b, a first inverter 213b, a second inverter 214b, a first buffer 215b, and a second buffer 216b. The input signal $V_{IN}$ may correspond to the input signal $V_{IN}$ in the form of a single-ended signal described with reference to FIG. 4.

The VTC 210b may output two output signals, e.g., the output signals VTC_P and VTC_N, based on the input signal $V_{IN}$ and the reference voltage $V_{REF}$. Herein, the two output signals VTC_P and VTC_N may be in the form of a differential signal pair.

In an embodiment, the input signal $V_{IN}$ may be in the form of a single-ended signal, and the reference voltage $V_{REF}$ may be a voltage applied to the VTC 210b from a circuit outside the VTC 210b, which is included in the receiver 200 (see FIG. 1). For example, the input signal $V_{IN}$ may be transmitted from the transmitter 100 (see FIG. 1) to the receiver 200 (see FIG. 1) in the form of a single-ended signal. Alternatively, a calibration circuit 250 to be described below with reference to FIG. 11 may apply the reference voltage $V_{REF}$ to the VTC 210b.

Referring to FIG. 8, the first linearization circuit 211b may be connected between the first node N1 to which the clock signal CLK is applied and the second node N2. The first inverter 213b may be connected between the first node N1 to which the clock signal CLK is applied and the second node N2. The first buffer 215b may be connected to the second node N2 and output the first output signal VTC_P.

The second linearization circuit 212b may be connected between the third node N3 to which the clock signal CLK is applied and the fourth node N4. The second inverter 214b may be connected between the third node N3 to which the clock signal CLK is applied and the fourth node N4. The second buffer 216b may be connected to the fourth node N4 and output the second output signal VTC_N.

Referring to FIG. 8, the first linearization circuit 211b may include the first P-type transistor $M_{p1}$ having a gate terminal through which the input signal $V_{IN}$ is received as an input value, a source terminal connected to the second node N2, and a drain terminal connected to the first node N1, and the first N-type transistor $M_{n1}$ having a gate terminal through which the reference voltage $V_{REF}$ is received as an input value, a source terminal connected to the second node N2, and a drain terminal connected to the first node N1.

In addition, the second linearization circuit 212b may include the third P-type transistor $M_{p3}$ having a gate terminal through which the reference voltage $V_{REF}$ is received as an input value, a source terminal connected to the fourth node N4, and a drain terminal connected to the third node N3, and the third N-type transistor $M_{n3}$ having a gate terminal through which the input signal $V_{IN}$ is received as an input value, a source terminal connected to the fourth node N4, and a drain terminal connected to the third node N3.

Although not shown in FIG. 8, in another embodiment, the first linearization circuit 211b may include a P-type transistor having a gate terminal through which the reference voltage $V_{REF}$ is received as an input value, a source terminal connected to the second node N2, and a drain terminal connected to the first node N1, and an N-type transistor having a gate terminal through which the input signal $V_{IN}$ is received as an input value, a source terminal connected to the second node N2, and a drain terminal connected to the first node N1.

In addition, the second linearization circuit 212b may include a P-type transistor having a gate terminal through which the input signal $V_{IN}$ is received as an input value, a source terminal connected to the fourth node N4, and a drain terminal connected to the third node N3, and an N-type transistor having a gate terminal through which the reference voltage $V_{REF}$ is received as an input value, a source terminal connected to the fourth node N4, and a drain terminal connected to the third node N3.

That is, each of the first linearization circuit 211b and the second linearization circuit 212b may be implemented by a plurality of switches, and the plurality of switches included in each of the first and second linearization circuits 211b and 212b may be implemented by switches (e.g., an NMOS and a PMOS) in complementary relations. In FIG. 8, the first P-type transistor $M_{p1}$ and the first N-type transistor $M_{n1}$ may correspond to the plurality of switches.

In addition, when the same input signal is applied to the first and second linearization circuits 211b and 212b, a first switch included in the first linearization circuit 211b, to which the input signal is applied, and a second switch included in the second linearization circuit 212b, to which the input signal is applied, may be implemented by switches (e.g., an NMOS and a PMOS) in complementary relations. In FIG. 8, the first P-type transistor $M_{p1}$ and the third N-type transistor $M_{n3}$ may correspond to the first and second switches, respectively.

Referring to FIG. 8, the first inverter 213b may include the second P-type transistor $M_{p2}$ and a second N-type transistor $M_{n2}$ in the form of a CMOS device, and the second inverter 214b may include a fourth P-type transistor $M_{p4}$ and a fourth N-type transistor $M_{n4}$ in the form of a CMOS device.

The second P-type transistor $M_{p2}$ may have a source terminal to which the VDD voltage is applied, a gate terminal connected to the first node N1, and a drain terminal connected to the second node N2. The second N-type transistor $M_{n2}$ may have a source terminal to which the ground voltage is applied, a gate terminal connected to the first node N1, and a drain terminal connected to the second node N2.

The fourth P-type transistor $M_{p4}$ may have a source terminal to which the VDD voltage is applied, a gate terminal connected to the third node N3, and a drain terminal connected to the fourth node N4. The fourth N-type transistor $M_{n4}$ may have a source terminal to which the ground voltage is applied, a gate terminal connected to the third node N3, and a drain terminal connected to the fourth node N4.

The first buffer 215b may output the first output signal VTC_P by amplifying a signal of the second node N2. In addition, the second buffer 216b may output the second output signal VTC_N by amplifying a signal of the fourth node N4.

As described above with reference to FIGS. 5 to 7, according to the inventive concept, by connecting, in parallel to inverters, the source terminals and the drain terminals of a P-type transistor and an N-type transistor of which the gate terminals receive an input signal as an input value, respectively, the on-resistances of the transistors $M_{p1}$, $M_{p2}$, $M_{p3}$, $M_{p4}$, $M_{n1}$, $M_{n2}$, $M_{n3}$, and $M_{n4}$ are inversely proportional to the delay times of the output signals VTC_P and VTC_N. In particular, the on-resistances of the transistors $M_{p1}$, $M_{p3}$, $M_{n1}$, and $M_{n3}$ included in the first and second linearization circuits 211*b* and 212*b* are inversely proportional to the delay times of the output signals VTC_P and VTC_N, respectively. By doing this, the linearity of a VTC gain may be improved. It would be obvious that the VTC 210*b* described with reference to FIG. 8 also exhibits this effect.

FIG. 9 is a graph illustrating the output signals VTC_P and VTC_N of the VTC 210*b* according to an embodiment. In particular, FIG. 9 is a graph illustrating the output signals VTC_P and VTC_N of the VTC 210*b* according to an embodiment when the reference voltage $V_{REF}$ is 0.25 V. Referring to FIG. 9, the output signals VTC_P and VTC_N having different clock-to-Q delay times are output based on the clock signal CLK according to voltage values of the input signal $V_{IN}$. In detail, the time points where falling edges of the signals VTC_P and VTC_N occur are shown as different from each other according to a voltage value of the input signal $V_{IN}$.

Referring to FIG. 9, when a voltage value of the input signal $V_{IN}$ is 0.25 V, the voltage value of the reference voltage $V_{REF}$ is the same as the voltage value of the input signal $V_{IN}$, and thus, the output signals VTC_P and VTC_N having the same clock-to-Q delay time may be output. That is, the clock-to-Q delay time of the first output signal VTC_P is the same as the clock-to-Q delay time of the second output signal VTC_N.

However, when a voltage value of the input signal $V_{IN}$ is greater than or equal to 0 V and less than 0.25 V, as the voltage value of the input signal $V_{IN}$ increases, the clock-to-Q delay time of the first output signal VTC_P increases from a minimum value ($V_{IN}$=0 V) to a median value ($V_{IN}$=0.25 V). That is, the clock-to-Q delay time of the first output signal VTC_P is proportional to the voltage value of the input signal $V_{IN}$. On the contrary, as the voltage value of the input signal $V_{IN}$ increases, the clock-to-Q delay time of the second output signal VTC_N decreases from a maximum value ($V_{IN}$=0 V) to the median value ($V_{IN}$=0.25 V). That is, the clock-to-Q delay time of the second output signal VTC_N is inversely proportional to the voltage value of the input signal $V_{IN}$.

Alternatively, when a voltage value of the input signal $V_{IN}$ is greater than 0.25 V and less than or equal to 0.5 V, as the voltage value of the input signal $V_{IN}$ increases, the clock-to-Q delay time of the first output signal VTC_P increases from the median value ($V_{IN}$=0.25 V) to the maximum value ($V_{IN}$=0.5 V). That is, the clock-to-Q delay time of the first output signal VTC_P is proportional to the voltage value of the input signal $V_{IN}$. On the contrary, as the voltage value of the input signal $V_{IN}$ increases, the clock-to-Q delay time of the second output signal VTC_N decreases from the median value ($V_{IN}$=0.25 V) to the minimum value ($V_{IN}$=0.5 V). Thus, the clock-to-Q delay time of the second output signal VTC_N is inversely proportional to the voltage value of the input signal $V_{IN}$. Accordingly, the clock-to-Q delay time of the first output signal VTC_P and the clock-to-Q delay time of the second output signal VTC_N are in complementary relation to each other based on the voltage value of the input signal $V_{IN}$.

Figure 10:
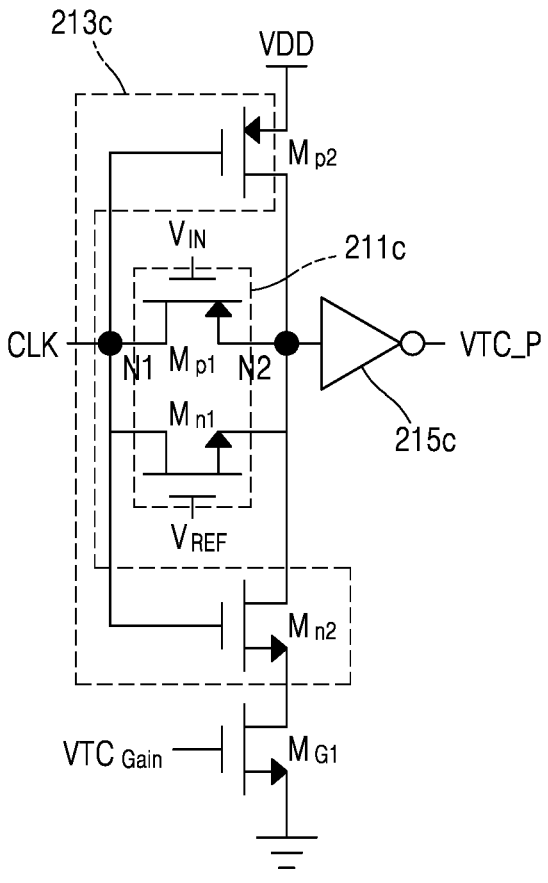
FIG. 10 is a circuit diagram illustrating an equivalent circuit of a VTC according to an embodiment.
Figure 10:
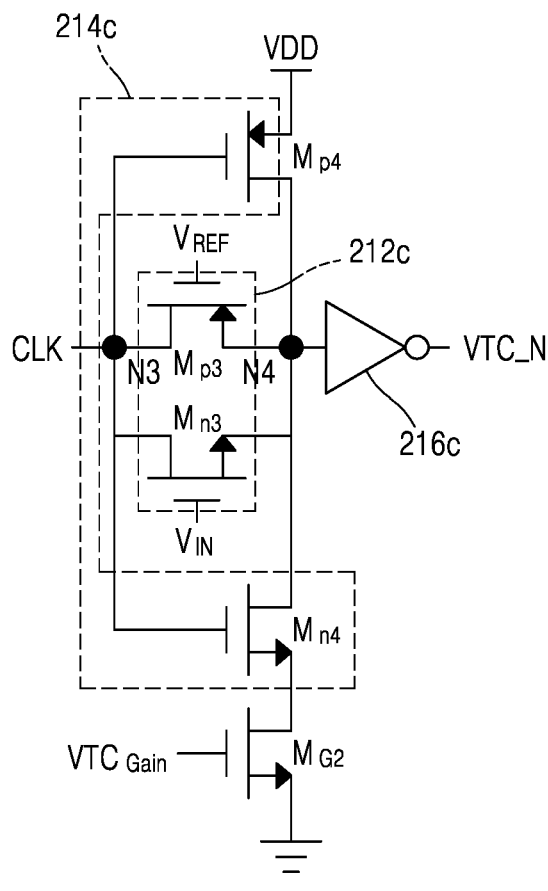

FIG. 10 is a circuit diagram illustrating an equivalent circuit of a VTC 210*c* according to an embodiment. Referring to FIG. 10, the VTC 210*c* may include a first linearization circuit 211*c*, a second linearization circuit 212*c*, a first inverter 213*c*, a second inverter 214*c*, a first buffer 215*c*, and a second buffer 216*c* and further include a VTC gain control circuit $M_{G1}$ and $M_{G2}$. Herein, the input signal $V_{IN}$ may correspond to the input signal $V_{IN}$ in the form of a single-ended signal described with reference to FIG. 4.

The VTC 210*c* may output two output signals, e.g., the output signals VTC_P and VTC_N, based on the input signal $V_{IN}$, the reference voltage $V_{REF}$, and a VTC gain control voltage $VTC_{Gain}$. Herein, the two output signals VTC_P and VTC_N may be in the form of a differential signal pair. That is, the VTC 210*c* may achieve a desired VTC gain by receiving the VTC gain control voltage $VTC_{Gain}$ as an input value.

In an embodiment, the input signal $V_{IN}$ may be in the form of a single-ended signal, and the reference voltage $V_{REF}$ may be a voltage applied to the VTC 210*c* from a circuit outside the VTC 210*c*, which is included in the receiver 200 (see FIG. 1). For example, the input signal $V_{IN}$ may be transmitted from the transmitter 100 (see FIG. 1) to the receiver 200 (see FIG. 1) in the form of a single-ended signal. Alternatively, the calibration circuit 250 to be described below with reference to FIG. 11 may apply the reference voltage $V_{REF}$ and the VTC gain control voltage $VTC_{Gain}$ to the VTC 210*c*.

Referring to FIG. 10, the VTC gain control circuit $M_{G1}$ and $M_{G2}$ may include a first VTC gain control transistor $M_{G1}$ and a second VTC gain control transistor $M_{G2}$.

The first linearization circuit 211*c* may be connected between the first node N1 to which the clock signal CLK is applied and the second node N2. The first inverter 213*c* may be connected between the first node N1 to which the clock signal CLK is applied and the second node N2. The first buffer 215*c* may be connected to the second node N2 and output the first output signal VTC_P. The first VTC gain control transistor $M_{G1}$ may be connected to the first inverter 213*c*.

The second linearization circuit 212*c* may be connected between the third node N3 to which the clock signal CLK is applied and the fourth node N4. The second inverter 214*c* may be connected between the third node N3 to which the clock signal CLK is applied and the fourth node N4. The second buffer 216*c* may be connected to the fourth node N4 and output the second output signal VTC_N. The second VTC gain control transistor $M_{G2}$ may be connected to the second inverter 214*c*.

Referring to FIG. 10, the first linearization circuit 211*c* may include the first P-type transistor $M_{p1}$ having a gate terminal through which the input signal $V_{IN}$ is received as an input value, a source terminal connected to the second node N2, and a drain terminal connected to the first node N1, and the first N-type transistor $M_{n1}$ having a gate terminal through which the reference voltage $V_{REF}$ is received as an input value, a source terminal connected to the second node N2, and a drain terminal connected to the first node N1.

In addition, the second linearization circuit 212*c* may include the third P-type transistor $M_{p3}$ having a gate terminal through which the reference voltage $V_{REF}$ is received as an input value, a source terminal connected to the fourth node N4, and a drain terminal connected to the third node N3, and the third N-type transistor $M_{n3}$ having a gate terminal through which the input signal $V_{IN}$ is received as an input value, a source terminal connected to the fourth node N4, and a drain terminal connected to the third node N3. Unlike as shown in FIG. 10, in another embodiment, the first linearization circuit 211*c* may include a P-type transistor having a gate terminal through which the reference voltage $V_{REF}$ is received as an input value, a source terminal connected to the second node N2, and a drain terminal connected to the first node N1, and an N-type transistor having a gate terminal through which the input signal $V_{IN}$ is received as an input value, a source terminal connected to the second node N2, and a drain terminal connected to the first node N1.

In addition, the second linearization circuit 212c may include a P-type transistor having a gate terminal through which the input signal $V_{IN}$ is received as an input value, a source terminal connected to the fourth node N4, and a drain terminal connected to the third node N3, and an N-type transistor having a gate terminal through which the reference voltage $V_{REF}$ is received as an input value, a source terminal connected to the fourth node N4, and a drain terminal connected to the third node N3.

Thus, each of the first linearization circuit 211c and the second linearization circuit 212c may be implemented by a plurality of switches, and the plurality of switches included in each of the first and second linearization circuits 211c and 212c may be implemented by switches (e.g., an NMOS and a PMOS) in complementary relationship to each other. For example, in FIG. 10, the first P-type transistor $M_{p1}$ and the first N-type transistor $M_{n1}$ may correspond to the plurality of switches.

In addition, when the same input signal is applied to the first and second linearization circuits 211c and 212c, a first switch included in the first linearization circuit 211c, to which the input signal is applied, and a second switch included in the second linearization circuit 212c, to which the input signal is applied, may be implemented by switches (e.g., an NMOS and a PMOS) in complementary relationship. In FIG. 10, the first P-type transistor $M_{p1}$ and the third N-type transistor $M_{n3}$ may correspond to the first and second switches, respectively.

Referring to FIG. 10, the first inverter 213c may include the second P-type transistor $M_{p2}$ and the second N-type transistor $M_{n2}$ in the form of a CMOS device, and the second inverter 214c may include the fourth P-type transistor $M_{p4}$ and the fourth N-type transistor $M_{n4}$ in the form of a CMOS device.

The second P-type transistor $M_{p2}$ may have a source terminal to which the VDD voltage is applied, a gate terminal connected to the first node N1, and a drain terminal connected to the second node N2. The second N-type transistor $M_{n2}$ may have a source terminal connected to the drain terminal of the first VTC gain control transistor $M_{G1}$, a gate terminal connected to the first node N1, and a drain terminal connected to the second node N2.

The fourth P-type transistor $M_{p4}$ may have a source terminal to which the VDD voltage is applied, a gate terminal connected to the third node N3, and a drain terminal connected to the fourth node N4. The fourth N-type transistor $M_{n4}$ may have a source terminal connected to the drain terminal of the second VTC gain control transistor $M_{G2}$, a gate terminal connected to the third node N3, and a drain terminal connected to the fourth node N4.

The first buffer 215c may output the first output signal VTC_P by amplifying a signal of the second node N2. In addition, the second buffer 216c may output the second output signal VTC_N by amplifying a signal of the fourth node N4.

The first VTC gain control transistor $M_{G1}$ may control the VTC gain of the first output signal VTC_P by applying the VTC gain control voltage $VTC_{Gain}$ to the gate terminal thereof, connecting the drain terminal thereof to the source terminal of the second N-type transistor $M_{n2}$ included in the first inverter 213c, and applying the ground voltage to the source terminal thereof.

The second VTC gain control transistor $M_{G2}$ may control the VTC gain of the second output signal VTC_N by applying the VTC gain control voltage $VTC_{Gain}$ to the gate terminal thereof, connecting the drain terminal thereof to the source terminal of the fourth N-type transistor $M_{n4}$ included in the second inverter 214c, and applying the ground voltage to the source terminal thereof.

As described above with reference to FIGS. 5 to 7, according to the inventive concept, by connecting in parallel to inverters, the source terminals and the drain terminals of a P-type transistor and an N-type transistor of which the gate terminals receive an input signal as an input value, respectively, the on-resistances of the transistors $M_{p1}$, $M_{p2}$, $M_{p3}$, $M_{p4}$, $M_{n1}$, $M_{n2}$, $M_{n3}$, and $M_{n4}$ are inversely proportional to the delay times of the output signals VTC_P and VTC_N. In particular, the on-resistances of the transistors $M_{p1}$, $M_{p3}$, $M_{n1}$, and $M_{n3}$ included in the first and second linearization circuits 211c and 212c are inversely proportional to the delay times of the output signals VTC_P and VTC_N, respectively. By doing this, the linearity of a VTC gain may be improved. It would be obvious that the VTC 210c described with reference to FIG. 10 also exhibits this effect. In addition, the VTC 210c described with reference to FIG. 10 may achieve a desired VTC gain by receiving the VTC gain control voltage $VTC_{Gain}$ as an input value.

Figure 11:
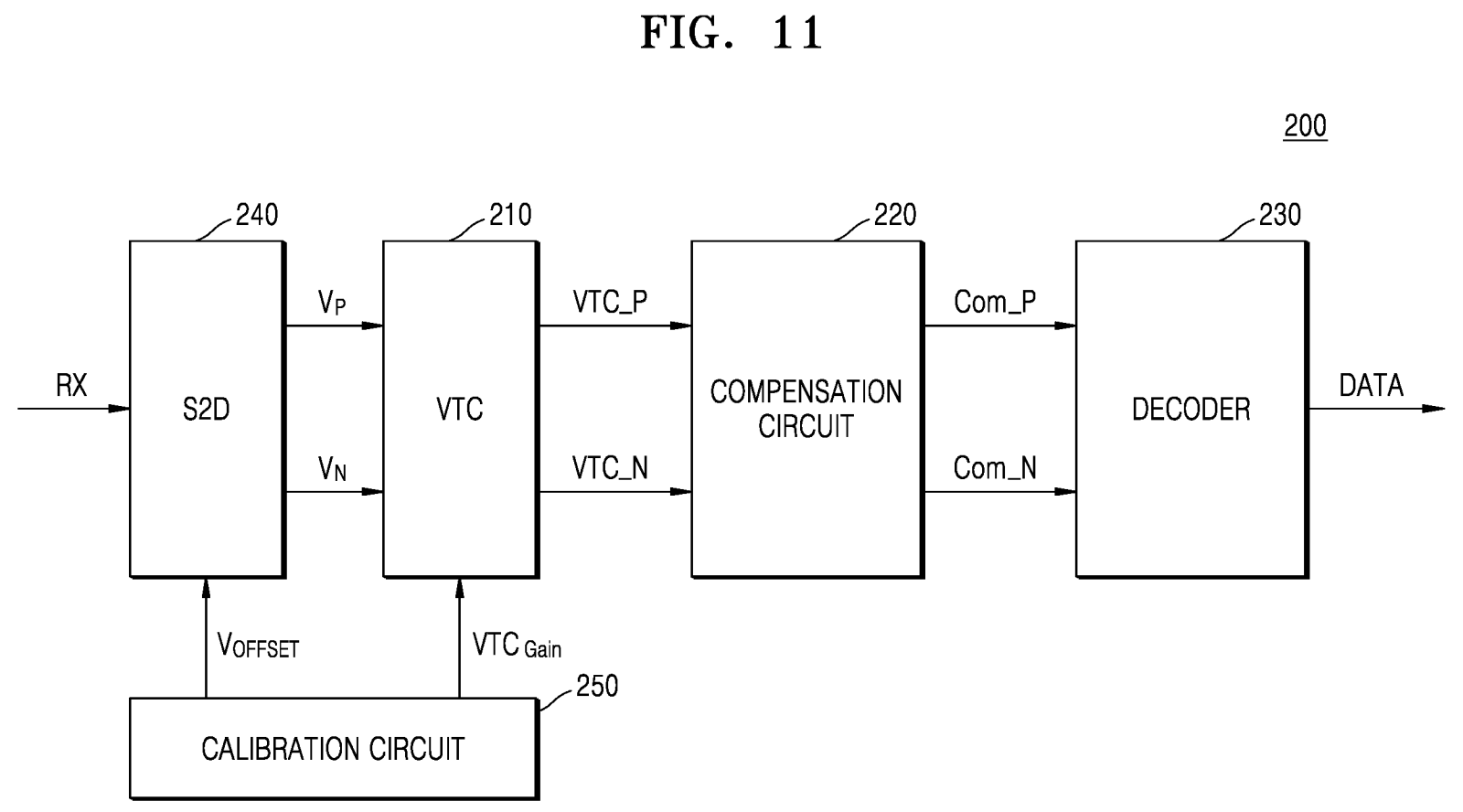

FIG. 11 is a block diagram illustrating a TB receiver 200 according to an embodiment. Referring to FIG. 11, the TB receiver 200 may include the VTC 210, the compensation circuit 220, and the decoder 230 and further include a single-to-differential amplifier (S2D) 240 and the calibration circuit 250. A description made with reference to FIG. 2 is not repeated herein. In addition, the VTC 210 of FIG. 11 may correspond to the VTCs 210a, 210b, and 210c described above with reference to FIGS. 3 to 10.

When an input signal RX is transmitted from the transmitter 100 (see FIG. 1) to the TB receiver 200 in the form of a single-ended signal, the S2D 240 may receive the input signal RX as an input value and output the output signals VP and VN in the form of a differential signal pair responding to the input signal RX. That is, the S2D 240 may receive the input signal RX in the form of a single-ended signal at a single input end thereof and output the output signals VP and VN in the form of a differential signal pair at output ends thereof.

The calibration circuit 250 may adjust receiver internal parameters to obtain a desired VTC gain. For example, the calibration circuit 250 may provide an offset voltage VOFFSET to the S2D 240 to decrease a receiver sensing margin. This may be similar to a feature that the VB receiver 200 decreases a sensing margin in a voltage domain of PAM signaling.

In addition, the calibration circuit 250 may provide the VTC gain control voltage $VTC_{Gain}$ to the VTC 210 to control the VTC gain of the VTC 210. By doing this, the VTC 210 may achieve a desired VTC gain by receiving the VTC gain control voltage VTC Gain as an input value. The calibration circuit 250 may also provide the reference voltage $V_{REF}$ described with reference to FIGS. 8 to 10 to the VTC 210 to control clock-to-Q delay times of the output signals VTC_P and VTC_N of the VTC 210. By doing this, the VTC 210 may receive the reference voltage $V_{REF}$ as an input value and output the output signals VTC_P and VTC_N having desired clock-to-Q delay times.

Figure 12:
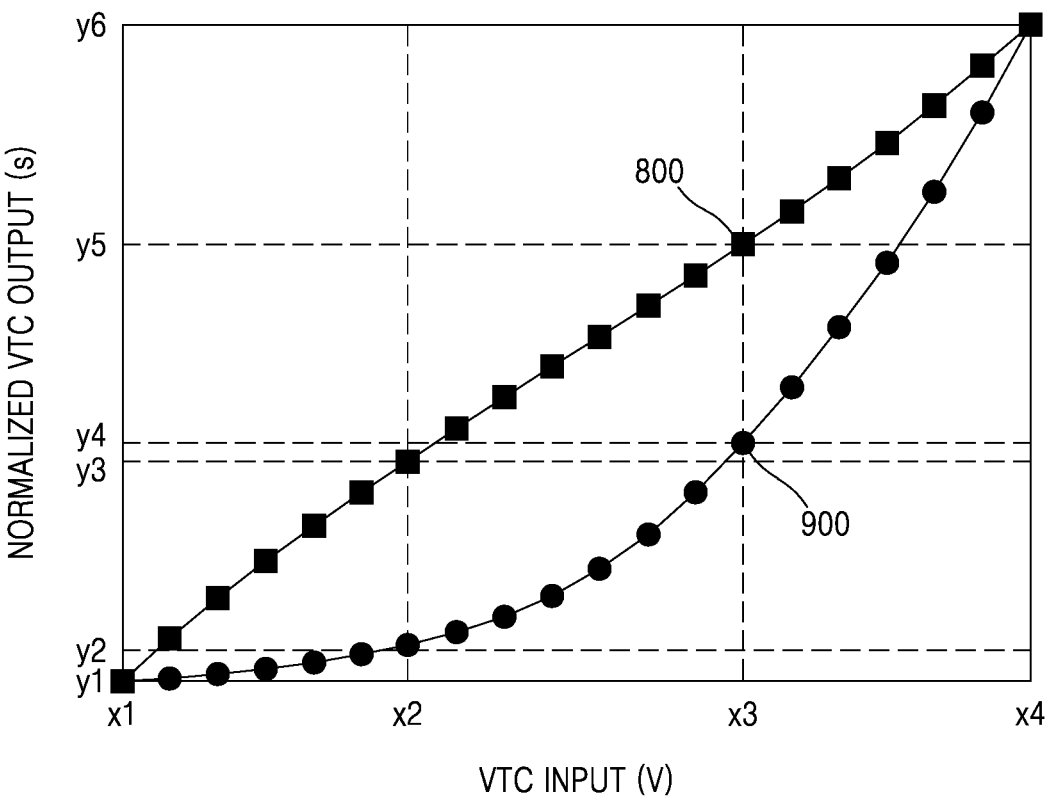
FIG. 12 is a graph illustrating an output value responding to an input value of a VTC according to an embodiment and an output value responding to the input value of a VTC according to a comparative example.

FIG. 12 is a graph illustrating an output value s responding to an input value V of a VTC according to an embodiment and an output value "s" responding to the input value V of a VTC according to a CE. Referring to FIG. 12, a graph

800 connecting quadrangular points shows a clock-to-Q delay time "s" of an output signal responding to a voltage value V of an input signal of the VTC 210 according to an embodiment, and a graph 900 connecting circular points shows a clock-to-Q delay time "s" of an output signal responding to the voltage value V of an input signal of the VTC 1000 according to a CE described above with reference to FIG. 7.

Referring to FIG. 12, when it is assumed that a ratio of level mismatch (RLM) of the VTC 1000 according to a CE is A and an RLM of the VTC 210 according to an embodiment is B, B is greater than A. Therefore, the linearity for an input and an output of the VTC 210 according to an embodiment is improved.

While the inventive concept has been particularly shown and described with reference to embodiments thereof, it will be understood that various changes in form and details may be made therein without departing from the spirit and scope of the following claims.

What is claimed is:

1. A voltage-to-time converter (VTC), comprising:
   a first inverter electrically connected between a first node to which a clock signal is applied and a second node;
   a first buffer electrically connected to the second node and to output a first output signal;
   a second inverter electrically connected between a third node to which the clock signal is applied and a fourth node; and
   a second buffer electrically connected to the fourth node to output a second output signal;
   a first linearization circuit configured to receive a first input signal and electrically connected between the first node and the second node; and
   a second linearization circuit configured to receive a second input signal and electrically connected between the third node and the fourth node.

2. The VTC of claim 1, wherein an on-resistance of a transistor included in the first inverter is inversely proportional to a variation in delay time between the first input signal and the first output signal.

3. The VTC of claim 1, wherein an on-resistance of a transistor included in the first linearization circuit is inversely proportional to a variation in delay time between the first input signal and the first output signal.

4. The VTC of claim 1, wherein the first linearization circuit comprises: a first P-type transistor having a drain terminal electrically connected to the first node, a source terminal electrically connected to the second node, and a gate terminal responsive to the first input signal as an input value.

5. The VTC of claim 1, wherein the first input signal and the second input signal are related as a differential signal pair.

6. The VTC of claim 1, wherein the first linearization circuit comprises:
   a first P-type transistor having a source terminal electrically connected to the second node, a drain terminal electrically connected to the first node, and a gate terminal responsive to the first input signal as an input value; and
   a first N-type transistor having a source terminal electrically connected to the second node, a drain terminal electrically connected to the first node, and a gate terminal responsive to a reference voltage as an input value.

7. The VTC of claim 1, wherein the first input signal and the second input signal are an equivalent single-ended signal.

8. The VTC of claim 1, further comprising:
   a first VTC gain control transistor;
   wherein the first inverter comprises:
   a second P-type transistor having a source terminal to which a positive supply voltage is applied, a gate terminal electrically connected to the first node, and a drain terminal electrically connected to the second node; and
   a second N-type transistor having a gate terminal electrically connected to the first node, and a drain terminal electrically connected to the second node; and
   wherein the first VTC gain control transistor has a gate terminal to which a VTC gain control voltage is applied, a drain terminal electrically connected to a source terminal of the second N-type transistor, and a source terminal to which a ground voltage is applied.

9. A time-based (TB) receiver, comprising:
   a voltage-to-time converter (VTC) configured to receive an input signal and output two output signals having different delay times that reflect a data value of the input signal, which is based on a delay time difference between the two output signals;
   a compensation circuit configured to receive the two output signals as a pair of input values, and output compensation signals by removing noise in the form of inter-symbol interference (ISI) from the pair of input values; and
   a decoder configured to reconstruct a digital signal from the compensation signals; and
   wherein on-resistances of transistors included in the VTC are inversely proportional to corresponding delay times between the input signal and the two output signals.

10. The TB receiver of claim 9,
   wherein the input signal includes a first input signal and a second input signal; and
   wherein VTC comprises:
   a first inverter electrically connected between a first node to which a clock signal is applied, and a second node;
   a first buffer electrically connected to the second node, and to output a first output signal;
   a second inverter electrically connected between a third node to which the clock signal is applied, and a fourth node;
   a second buffer electrically connected to the fourth node, and to output a second output signal;
   a first linearization circuit configured to receive the first input signal and electrically connected between the first node and the second node; and
   a second linearization circuit configured to receive the second input signal and electrically connected between the third node and the fourth node.

11. The TB receiver of claim 10, wherein the first linearization circuit comprises a first P-type transistor having a drain terminal electrically connected to the first node, a source terminal electrically connected to the second node, and a gate terminal, which is configured to receive the first input signal as an input value.

12. The TB receiver of claim 10, wherein the first input signal and the second input signal are one differential signal pair.

13. The TB receiver of claim 10, wherein the first linearization circuit comprises:
   a first P-type transistor having a gate terminal configured to receive the first input signal as an input value, a source terminal electrically connected to the second
node, and a drain terminal electrically connected to the
first node; and a first N-type transistor having a gate terminal configured
to receive a reference voltage as an input value, a
source terminal electrically connected to the second
node, and a drain terminal electrically connected to the
first node.

14. The TB receiver of claim 10, wherein the first and
second input signals are equivalent signals.

15. The TB receiver of claim 10, further comprising:

a first VTC gain control transistor having a gate terminal
configured to receive a VTC gain control voltage, and
a source terminal to which a ground voltage is applied;
and wherein the first inverter comprises:

a second P-type transistor having a source terminal to
which a positive supply voltage is applied, a gate
terminal electrically connected to the first node, and a
drain terminal electrically connected to the second
node; and a second N-type transistor having a gate terminal electri-
cally connected to the first node, a drain terminal
electrically connected to the second node, and a source
terminal electrically connected to a drain terminal of
the first VTC gain control transistor.

16. A transmission and reception system, comprising:

a transmitter configured to output a transmission signal
based on multi-level signaling; and a time-based (TB) receiver responsive to the transmission
signal, said TB receiver comprising:

a voltage-to-time converter (VTC) configured to receive
an input signal and output two output signals having
different delay times so as to identify a data value of the
input signal based on a delay time difference of the
output signals, said VTC including transistors having
on-resistances that are inversely proportional to corre-
sponding delay times between the transmission signal
and the output signals.

17. The system of claim 16, wherein the transmission signal includes a first input
signal and a second input signal; and wherein the VTC comprises:

a first inverter electrically connected between a first node to
which a clock signal is applied and a second node;

a first buffer electrically connected to the second node,
and to output a first output signal;

a second inverter electrically connected between a third
node to which the clock signal is applied and a fourth
node;

a second buffer electrically connected to the fourth node,
and to output a second output signal;

a first linearization circuit configured to receive the first
input signal, and electrically connected between the
first node and the second node; and a second linearization circuit configured to receive the
second input signal, and electrically connected between
the third node and the fourth node.

18. The system of claim 17, wherein the first linearization
circuit comprises a first P-type transistor having a drain
terminal electrically connected to the first node, a source
terminal electrically connected to the second node, and a
gate terminal configured to receive the first input signal as an
input value.

19. The system of claim 17, wherein the first linearization
circuit comprises:

a first P-type transistor having a gate terminal configured
to receive the first input signal as an input value, a
source terminal electrically connected to the second
node, and a drain terminal electrically connected to the
first node; and a first N-type transistor having a gate terminal configured to
receive a reference voltage as an input value, a source
terminal electrically connected to the second node, and a
drain terminal electrically connected to the first node.

20. The system of claim 17, further comprising:

a first VTC gain control transistor having a gate terminal
to which a VTC gain control voltage is applied, and a
source terminal to which a ground voltage is applied;
and wherein the first inverter comprises:

a second P-type transistor having a source terminal to
which a positive supply voltage is applied, a gate
terminal electrically connected to the first node, and a
drain terminal electrically connected to the second
node; and a second N-type transistor having a gate terminal electri-
cally connected to the first node, a drain terminal
electrically connected to the second node, and a source
terminal electrically connected to a drain terminal of
the VTC gain control transistor.

* * * * *